(12) United States Patent
Endo et al.

(10) Patent No.: US 6,174,650 B1
(45) Date of Patent: Jan. 16, 2001

(54) MANUFACTURING METHOD AND APPARATUS FOR SEMICONDUCTOR DEVICE

(75) Inventors: Masayuki Endo, Osaka; Toru Fukumoto, Kyoto; Hiromi Ohsaki, Niigata, all of (JP)

(73) Assignee: Matsushita Electric Industrial Co., Ltd., Osaka (JP)

( * ) Notice: Under 35 U.S.C. 154(b), the term of this patent shall be extended for 0 days.

(21) Appl. No.: 09/010,830

(22) Filed: Jan. 22, 1998

(30) Foreign Application Priority Data

Jan. 23, 1997 (JP) .................................... 9-010014

(51) Int. Cl.$^7$ ....................................................... G03F 7/00
(52) U.S. Cl. .......................... 430/327; 430/315; 430/322; 430/324
(58) Field of Search .................................. 430/312, 322, 430/327, 315, 324; 427/402, 407.1

(56) References Cited

U.S. PATENT DOCUMENTS

| | | | | |
|---|---|---|---|---|
| 3,506,441 | * | 4/1970 | Gottfried | 430/312 |
| 5,091,290 | | 2/1992 | Rolfson | 430/327 |
| 5,312,717 | | 5/1994 | Sachdev et al. | 430/313 |
| 5,391,913 | | 2/1995 | Mino et al. | 257/632 |
| 5,468,597 | * | 11/1995 | Calabrese | 430/315 |
| 5,702,767 | | 12/1997 | Peterson et al. | 427/407.1 |
| 6,054,255 | * | 4/2000 | Nakaoka | 430/327 |

FOREIGN PATENT DOCUMENTS

| | | |
|---|---|---|
| 0278996 | 2/1987 | (EP) . |
| 0260977 | 9/1987 | (EP) . |
| 0 291 670 A1 | 11/1988 | (EP) . |
| 0 515 212 A1 | 11/1992 | (EP) . |
| 0 691 674 A2 | 1/1996 | (EP) . |
| 0757290 | 8/1996 | (EP) . |
| 0837369 | 9/1997 | (EP) . |
| 2167686 | 5/1984 | (GB) . |
| 58-188132 | 11/1983 | (JP) . |
| 06350000 | 12/1994 | (JP) . |
| 11-116582 | * 4/1999 | (JP) . |
| WO 96/15861 | 5/1996 | (WO) . |

OTHER PUBLICATIONS

European Search Report for EP 98111894.6–2203, dated Nov. 9, 1998.
Notice of Reasons for Rejection (Taiwan Application No. 85108702) dated Dec. 15, 1998.
Pinnavaia, TJ, et al., "Triorganosilicon Acetylacetonates, Enol Ether Isomerism and Sterochemical Lability" Journal of the American Chemical Society, vol. 92, No. 15, Jul. 29, 1998 pp. 4544–4550.
S. A. MacDonald, et al., "Airborne Chemical Contamination of a Chemically Amplified Resist", Proc. of SPIE, vol. 1466, pp. 2–12, 1991.
A. Saiki, et al., "Development of Ammonia Adsorption Filter and its Application to LSI Manufacturing Environment", Journal of Photopolymer Science and Technology, vol. 8, pp. 599–606, 1995.

* cited by examiner

Primary Examiner—Mark F. Huff
Assistant Examiner—Nicole Barreca
(74) Attorney, Agent, or Firm—McDermott, Will & Emery

(57) ABSTRACT

In a clean room, after conducting a surface treatment on the surface of a semiconductor substrate with 4-trimethylsiloxy-3-penten-2-one, the treated surface of the semiconductor substrate is coated with a chemically amplified resist, thereby forming a first resist film. Then, the first resist film is successively subjected to exposure, PEB and development, thereby forming a first resist pattern of the chemically amplified resist. Next, in the same clean room, after conducting a surface treatment on the surface of the semiconductor substrate with 4-dimethyl-n-hexylsiloxy-3-penten-2-one, the treated surface of the semiconductor substrate is coated with a non-chemically amplified resist, thereby forming a second resist film. Then, the second resist film is successively subjected to the exposure, the PEB and the development, thereby forming a second resist pattern of the non-chemically amplified resist.

5 Claims, 13 Drawing Sheets

MANUFACTURING METHOD AND APPARATUS FOR SEMICONDUCTOR DEVICE

BACKGROUND OF THE INVENTION

The present invention relates to manufacturing method and apparatus for a semiconductor device. More particularly, it relates to manufacturing method and apparatus for a semiconductor device in which a resist pattern is formed on a semiconductor substrate.

In accordance with improved density and integration of a semiconductor device, there are increasing demands for finer processing techniques in these days.

As means for attaining the fine processing in the lithography process, a technique for forming a resist pattern out of a chemically amplified resist utilizing generation of an acid by using, as exposing light, DUV light emitted by an excimer laser as a light source or light with a short wavelength such as EB and X-rays has recently been developed.

Furthermore, since the manufacturing process of a semiconductor device always includes pattern formation which is less refined, a resist pattern is formed also out of a conventional resist other than the chemically amplified resist (hereinafter referred to as a "non-chemically amplified resist").

Now, pattern formation using a chemically amplified resist and pattern formation using a non-chemically amplified resist in a conventional method of manufacturing a semiconductor device will be described with reference to FIGS. 10 through 14.

First, the pattern formation using a chemically amplified resist will be described with reference to FIGS. 10, 11(a) and 11(b).

FIG. 10 shows a process flow of the resist pattern formation using a chemically amplified resist, and FIGS. 11(a) and 11(b) show the state of a surface of a semiconductor substrate obtained by the resist pattern formation using a chemically amplified resist.

As is shown in FIG. 11(a), a surface of a semiconductor substrate 1 of silicon is supplied with hexamethyldisilazane (hereinafter referred to as HMDS) serving as a surface treatment agent, thereby making the surface of the semiconductor substrate 1 hydrophobic. Thus, the adhesion of the semiconductor substrate 1 is improved. This surface treatment is carried out by bubbling HMDS in a liquid phase with a nitrogen gas and spraying the resultant HMDS for 30 seconds onto the surface of the semiconductor substrate 1 having been heated up to 60° C. As a result, H in OH groups existing on the surface of the semiconductor substrate 1 is substituted with $Si(CH_3)_3$ (i.e., a trimethylsilyl group) as is shown in FIG. 11(b), thereby making the surface of the semiconductor substrate 1 hydrophobic. Thus, the adhesion of the semiconductor substrate 1 is improved as well as $NH_3$ (ammonia) is generated.

Then, the surface of the semiconductor substrate 1 is coated with a chemically amplified resist so as to form a resist film. The resist film is exposed by using a desired mask, and is then subjected successively to post exposure bake (hereinafter refereed to as the PEB) and development. Thus, a resist pattern is formed.

Next, the pattern formation using a non-chemically amplified resist will be described with reference to FIGS. 12, 13(a) and 13(b).

FIG. 12 shows a process flow of the resist pattern formation using a non-chemically amplified resist, and FIGS. 13(a) and 13(b) show the state of a surface of a semiconductor substrate obtained by the resist pattern formation using a non-chemically amplified resist.

First, as is shown in FIG. 13(a), a surface of a semiconductor substrate 1 of silicon is supplied with HMDS serving as a surface treatment agent, thereby making the surface of the semiconductor substrate 1 hydrophobic. Thus, the adhesion of the semiconductor substrate 1 is improved. This surface treatment is carried out by bubbling HMDS in a liquid phase with a nitrogen gas and spraying the resultant HMDS for 30 seconds onto the surface of the semiconductor substrate 1 having been heated up to 60° C. As a result, H in OH groups existing on the surface of the semiconductor substrate 1 is substituted with $Si(CH_3)_3$ (i.e., a trimethylsilyl group) as is shown in FIG. 13(b), thereby making the surface of the semiconductor substrate 1 hydrophobic. Thus, the adhesion of the semiconductor substrate 1 is improved as well as $NH_3$ (ammonia) is generated.

Next, the surface of the semiconductor substrate 1 is coated with a none-chemically amplified resist so as to form a resist film. The resist film is exposed by using a desired mask, and is then subjected successively to the PEB and the development. Thus, a resist pattern is formed.

FIG. 14 is a schematic sectional view of the resist pattern 6 of a chemically amplified resist obtained by the former pattern formation, wherein an insoluble skin layer 7 is formed on the surface of the resist pattern 6. Such an insoluble skin layer 7 formed on the surface of the resist pattern 6 can cause dimensional variation of the resist pattern 6 and etching failure in following procedures, resulting in decreasing a yield of the semiconductor device. In contrast, the resist pattern of a non-chemically amplified resist does not have such a disadvantage because no insoluble skin layer is formed thereon.

An alkali component is regarded as a factor in forming the above-described insoluble skin layer 7 on the surface of the resist pattern 6 of a chemically amplified resist. Specifically, when an alkali component exists on the surface of the resist pattern 6, an acid generated through the exposure is deactivated, resulting in forming the insoluble skin layer 7. As a result, the surface of the resist pattern 6 is formed into a T-top shape. This is understandable also in consideration of a report that a pattern cannot be resolved when a large amount of an alkali component is included (S. A. MacDonald, et al., Proc. SPIE, Vol. 1446, p. 2 (1991)) as well as in consideration of a fact that no insoluble skin layer is formed on the resist pattern of a non-chemically amplified resist.

In order to find the cause of generation of an ammonia component, that is, an alkali component harmfully affecting a chemically amplified resist, the present inventors analyzed impurities included in the atmosphere in a clean room. As a result, it was found that there is positive correlation between a concentration of trimethylsilanol, that is, a decomposition of HMDS, and a concentration of ammonia in the atmosphere as is shown in FIG. 15. On the basis of this finding, it is considered that an alkali component harmfully affecting the formation of a pattern of a chemically amplified resist derives from HMDS used as a surface treatment agent for a semiconductor substrate.

Then, the surface of a semiconductor substrate was treated with a surface treatment agent which does not generate an alkali component, and a resist pattern was formed out of a chemically amplified resist on this semiconductor substrate. As a result, although the insoluble skin layer could be reduced as compared with the case where a resist pattern of a chemically amplified resist is formed by the conventional method, the insoluble skin layer was still formed.

SUMMARY OF THE INVENTION

In view of the aforementioned problems, the object of the invention is preventing an insoluble skin layer from being formed on the surface of a resist pattern of a chemically amplified resist.

It is considered that an alkali component harmfully affecting a resist pattern of a chemically amplified resist derives from HMDS. When HMDS is used as a surface treatment agent for the surface treatment in forming a resist pattern of a chemically amplified resist in one clean room, an alkali component generated from the HMDS spreads over this clean room. As a result, an insoluble skin layer is formed on the surface of the resist pattern of the chemically amplified resist.

The present invention was devised on the basis of the aforementioned finding. According to this invention, a surface treatment agent which does not produce an alkali component is used not only in the surface treatment in forming a resist film of a chemically amplified resist but also in the surface treatment in forming a resist film of a non-chemically amplified resist.

The method of manufacturing a semiconductor device of this invention comprises a first resist film forming step of forming a first resist film in a clean room by conducting a surface treatment on a semiconductor substrate with a surface treatment agent including a silane compound represented by the following general formula (1) and successively coating the treated surface of the semiconductor substrate with a chemically amplified resist:

$$R^1{}_{4-n}Si(OR)_n \qquad (1)$$

wherein n indicates an integer ranging between 1 and 3; R indicates a substituted or non-substituted saturated hydrocarbon group having 1 through 6 carbon atoms, a substituted or non-substituted unsaturated hydrocarbon group having 1 through 6 carbon atoms or a substituted or non-substituted alkylcarbonyl group having 1 through 6 carbon atoms; and $R^1$ is one group or a combination of two or more groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms and an alicyclic saturated hydrocarbon group having 3 through 6 carbon atoms; a first exposing step of exposing the first resist film in the clean room by using a mask having a desired pattern shape; a first developing step of forming a first resist pattern in the clean room by developing the exposed first resist film; a second resist film forming step of forming a second resist film in the clean room by conducting a surface treatment on the semiconductor substrate with a surface treatment agent including a silane compound represented by the general formula (1) and by successively coating the treated surface of the semiconductor substrate with a non-chemically amplified resist; a second exposing step of exposing the second resist film in the clean room by using a mask having a desired pattern shape; and a second developing step of forming a second resist pattern in the clean room by developing the exposed second resist film.

In the method of manufacturing a semiconductor device of this invention, in both the first resist film forming step and the second resist film forming step, which are conducted in the same clean room, the surface treatment is performed by using the surface treatment agent including the silane compound represented by the general formula (1). Therefore, no ammonia component is generated in any of these resist film forming steps, and hence, no alkali component exists in the clean room where the method of manufacturing a semiconductor device of this invention is adopted. Accordingly, no insoluble skin layer is formed on the surface of the first resist pattern of the chemically amplified resist, resulting in obtaining a resist pattern having a good pattern shape. In this case, the surface treatment agent used in the first resist film forming step can be the same as or different from the surface treatment agent used in the second resist film forming step.

Also, there is no need to form the first resist film and the second resist film in different atmospheres in fear of the harmful effect of an alkali component upon the first resist pattern of the chemically amplified resist, and hence, the through put can be improved. In particular, when the surface treatments are conducted by using the same surface treatment apparatus in the first resist film forming step and the second resist film forming step, the throughput of the surface treatment can be further improved and the foot print of the apparatus can be decreased. In this case, the used surface treatment agents can be the same or different from each other in the first and second resist film forming steps.

In the method of manufacturing a semiconductor device of this invention, the silane compound is preferably represented by the following general formula (2):

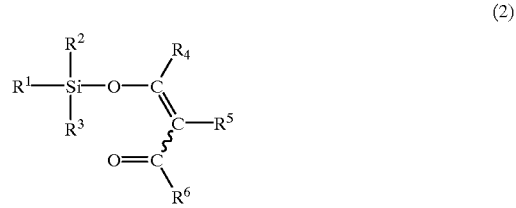

wherein $R^1$, $R^2$ and $R^3$ are the same or different groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms; and $R^4$, $R^5$ and $R^6$ are the same or different groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms, an alicyclic saturated hydrocarbon group having 3 through 6 carbon atoms and $OR^7$ (wherein $R^7$ is a hydrogen atom, a substituted or non-substituted saturated hydrocarbon group having 1 through 6 carbon atoms, a substituted or non-substituted unsaturated hydrocarbon group having 1 through 6 carbon atoms, or an alicyclic saturated hydrocarbon group having 3 through 6 carbon atoms).

In the silane compound represented by the general formula (2), the energy level of the electrophilic orbital is so low that a trimethylsilyl group included in the silane compound is highly reactive to an OH group existing on the substrate. Accordingly, a silicon atom included in the silane compound having a carbonyl group can very rapidly react to a silanol group, that is, a compound having an active hydrogen atom.

For example, as the silane compound represented by the general formula (2), 4-trimethylsiloxy-3-penten-2-one was mixed with 0.5 equivalent of cyclohexanol, so as to measure the rate of this reaction. The obtained reaction rate was as high as 100% in 1 hour. In contrast, when the same experiment was carried out by using HMDS, that is, the conventional surface treatment agent, the reaction rate was merely 43.9% in 24 hours.

The manufacturing apparatus for a semiconductor device of this invention is installed in a clean room, and comprises a first coater installed in a clean room for forming a first resist film by conducting a surface treatment on a semiconductor substrate with a surface treatment agent including a silane compound represented by the following general formula (1) and successively coating the treated surface of the semiconductor substrate with a chemically amplified resist:

$$R^1{}_{4-n}Si(OR)_n \tag{1}$$

wherein n indicates an integer ranging between 1 and 3; R indicates a substituted or non-substituted saturated hydrocarbon group having 1 through 6 carbon atoms, a substituted or non-substituted unsaturated hydrocarbon group having 1 through 6 carbon atoms or a substituted or non-substituted alkylcarbonyl group having 1 through 6 carbon atoms; and $R^1$ is one group or a combination of two or more groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms and an alicyclic saturated hydrocarbon group having 3 through 6 carbon atoms; a first exposure machine installed in the clean room for exposing the first resist film by using a mask having a desired pattern shape; a first developer installed in the clean room for forming a first resist pattern by developing the exposed first resist film; a second coater installed in the clean room for forming a second resist film by conducting a surface treatment on the semiconductor substrate with a surface treatment agent including a silane compound represented by the general formula (1) and by successively coating the treated surface of the semiconductor substrate with a non-chemically amplified resist; a second exposure machine installed in the clean room for exposing the second resist film by using a mask having a desired pattern shape; and a second developer installed in the clean room for forming a second resist pattern by developing the exposed second resist film.

In the manufacturing apparatus for a semiconductor device of this invention, both the first coater and the second coater installed in the same clean room conduct the surface treatments with the surface treatment agents including the silane compound represented by the general formula (1). Therefore, no ammonia component is generated in both coaters. Accordingly, no insoluble skin layer is formed on the surface of the first resist pattern of the chemically amplified resist, resulting in obtaining a resist pattern having a good pattern shape. The first coater and the second coater can be the same or different from each other.

In the manufacturing apparatus for a semiconductor device of this invention, the silane compound is preferably represented by the following general formula (2):

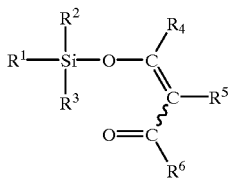

wherein $R^1$, $R^2$ and $R^3$ are the same or different groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms; and $R^4$, $R^5$ and $R^6$ are the same or different groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms, an alicyclic saturated hydrocarbon group having 3 through 6 carbon atoms and $OR^7$ (wherein $R^7$ is a hydrogen atom, a substituted or non-substituted saturated hydrocarbon group having 1 through 6 carbon atoms, a substituted or non-substituted unsaturated hydrocarbon group having 1 through 6 carbon atoms, or an alicyclic saturated hydrocarbon group having 3 through 6 carbon atoms).

When the silane compound represented by the general formula (2) is used in the surface treatment, a reaction rate between a Si atom and a silanol group existing on the semiconductor substrate can be improved.

When the silane compound represented by the general formula (2) is used in the manufacturing method or apparatus for a semiconductor device of this invention, the energy level of the electrophilic orbital is so low that a trimethylsilyl group included in the silane compound is highly reactive to a silanol group existing on the semiconductor substrate. Therefore, a large number of silyl groups of the silane compound are attached onto the surface of the semiconductor substrate, resulting in making the surface of the semiconductor substrate hydrophobic. Thus, the adhesion between the semiconductor substrate and a resist pattern formed thereon can be largely improved, and the resultant resist pattern can attain a good shape free from peeling.

In the manufacturing method or apparatus for a semiconductor device of this invention, when the chemically amplified resist includes an acid generator and a resin that is changed to be alkali-soluble by a function of an acid, deactivation of an acid caused in using a two-component system chemically amplified positive resist can be avoided.

Alternatively, when the chemically amplified resist includes an acid generator, an alkali-soluble resin and a compound or resin that is changed to be alkali-soluble by a function of an acid, the deactivation of an acid caused in using a three-component system chemically amplified positive resist can be avoided.

Furthermore, when the chemically amplified resist includes an acid generator, an alkali-soluble resin and a compound or resin that is crosslinked by a function of an acid, the deactivation of an acid caused in using a three-component system chemically amplified negative resist can be avoided.

Moreover, when the non-chemically amplified resist includes a naphthoquinone diazido compound and a novolak resin, adhesion of the resist pattern including the naphthoquinone diazido compound and the novolak resin can be improved.

DETAILED DESCRIPTION OF THE INVENTION

Figure 1:
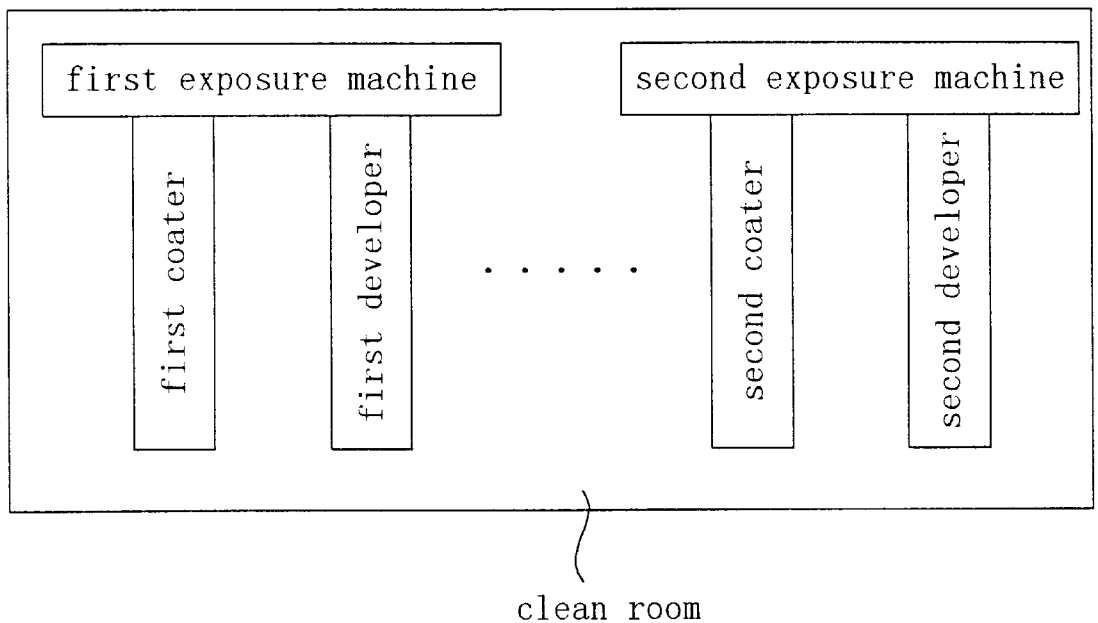
FIG. 1 is a schematic plan view for showing a layout of a manufacturing apparatus for a semiconductor device according to the present invention.

FIG. 1 is a schematic plan view of a clean room where a manufacturing apparatus for a semiconductor device according to this invention is installed. In this clean room, the following are installed: a first coater for forming a first resist film by conducting a surface treatment on a semiconductor substrate with a surface treatment agent including a silane compound and by subsequently coating the semiconductor substrate with a chemically amplified resist; a first exposure machine for conducting pattern exposure on the first resist film formed by the first coater; a first developer for developing the first resist film exposed by the first exposure machine; a second coater for forming a second resist film by conducting a surface treatment on the semiconductor substrate with a surface treatment agent including a silane compound and by subsequently coating the semiconductor substrate with a non-chemically amplified resist; a second exposure machine for conducting the pattern exposure on the second resist film formed by the second coater; and a second developer for developing the second resist film exposed by the second exposure machine. The first and second coaters can be the same or different from each other, and the same coater (manufactured by Tokyo Electron Ltd.; Mark 8) is herein used as them. Furthermore, this clean room is provided with a large number of other processing equipment in addition to the first and second coaters, the first and second exposure machines, and the first and second developers, but they are omitted in the drawing.

EMBODIMENT 1

The first half procedures of a method of manufacturing a semiconductor device according to a first embodiment using the aforementioned manufacturing apparatus will be described with reference to FIGS. 2, 3(a), 3(b) and 4. In these first half procedures, a first resist pattern of a chemically amplified resist is formed by using the first coater, the first exposure machine and the first developer.

Figure 2:
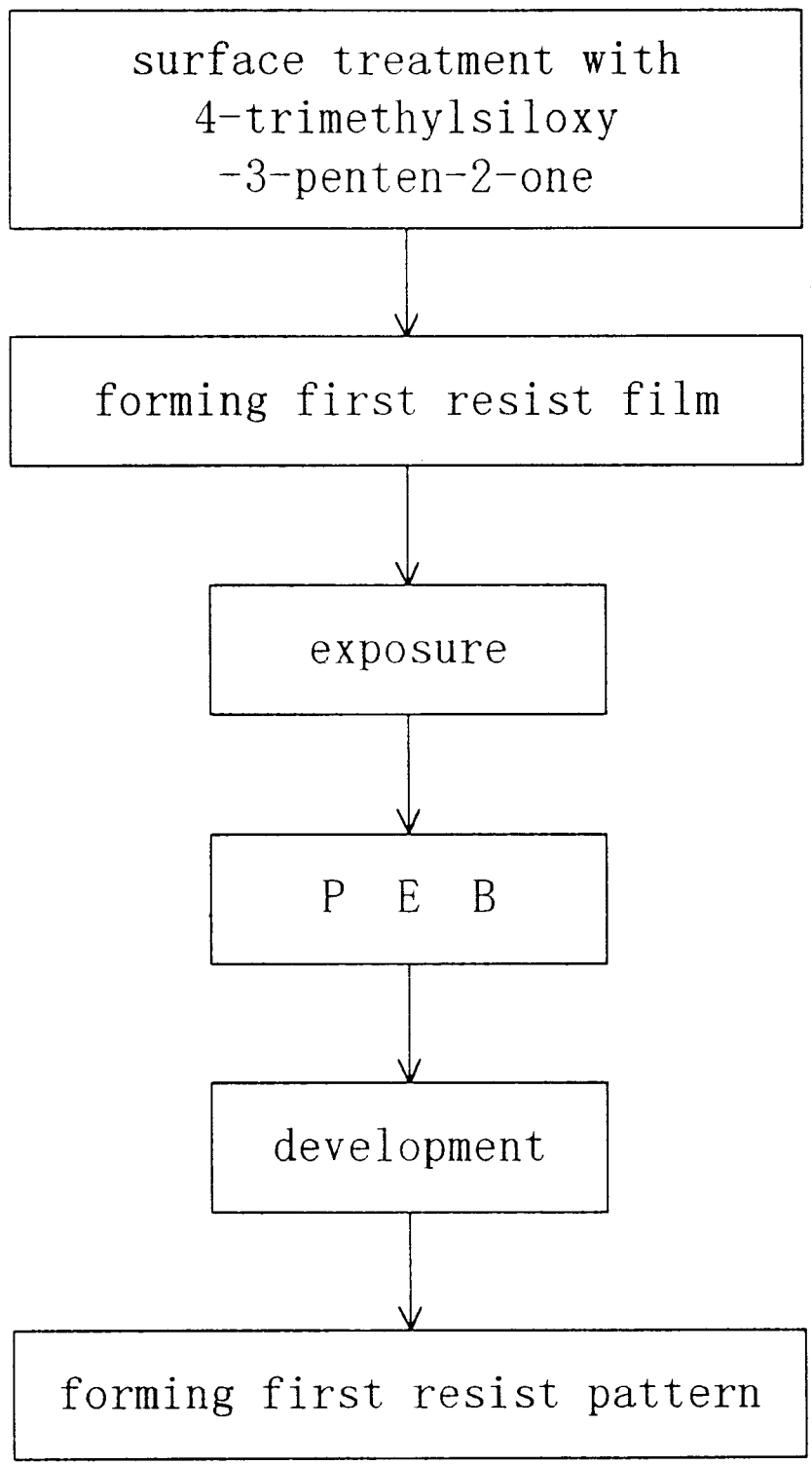
FIG. 2 is a flowchart for showing the first half procedures of a method of manufacturing a semiconductor device according to a first embodiment of the invention.
Figure 3A:
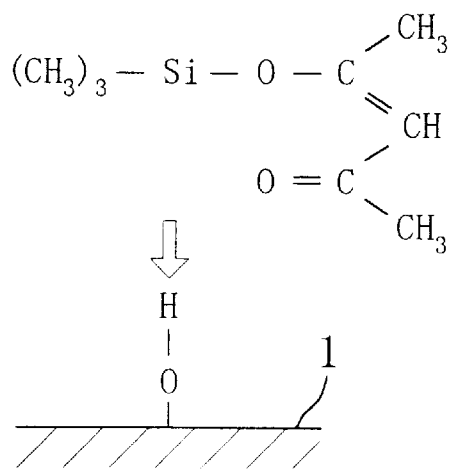
FIGS. 3(a) and 3(b) are schematic diagrams for showing the state of a surface of a semiconductor substrate obtained by supplying 4-trimethylsiloxy-3-penten-2-one in the method of manufacturing a semiconductor device of the first embodiment.
Figure 3B:
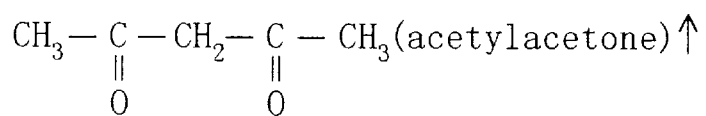
Figure 3B:
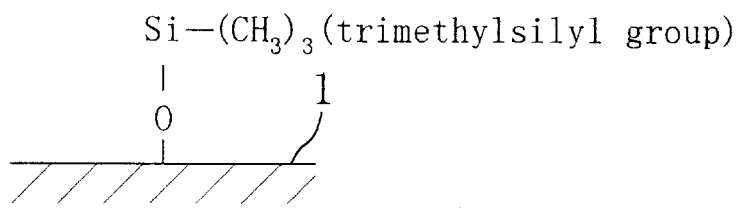
Figure 4:
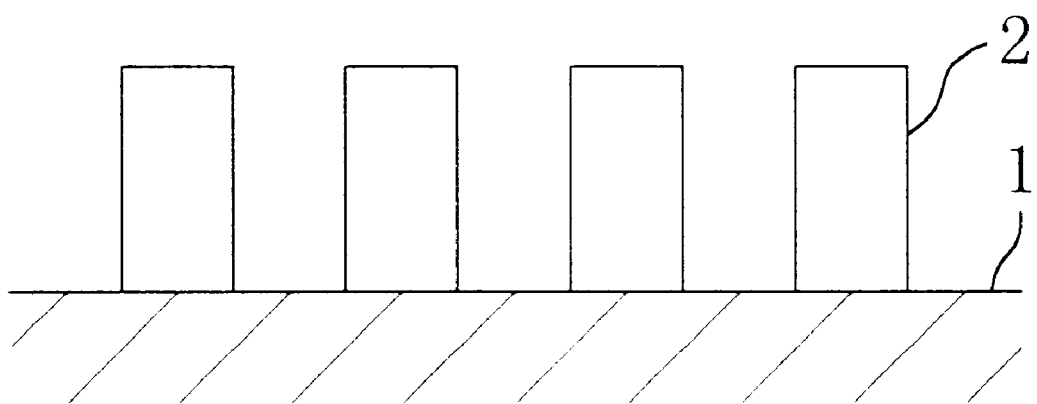
FIG. 4 is a schematic sectional view of a first resist pattern formed out of a chemically amplified resist by the method of manufacturing a semiconductor device of the first embodiment.

FIG. 2 is a flowchart for showing the procedures for forming a resist pattern of a chemically amplified resist, FIGS. 3(a) and 3(b) show the state of a surface of a semiconductor substrate obtained by conducting a surface treatment by using a surface treatment agent of the first embodiment, and FIG. 4 is a schematic sectional view of the resist pattern formed out of a chemically amplified resist on the semiconductor substrate whose surface has been treated with the surface treatment agent of the first embodiment.

First, by using the first coater, the surface of a semiconductor substrate 1 of silicon is supplied with 4-trimethylsiloxy-3-penten-2-one serving as the surface treatment agent as is shown in FIG. 3(a). Specifically, 4-trimethylsiloxy-3-penten-2-one is bubbled with a nitrogen gas and then sprayed for 30 seconds onto the surface of the semiconductor substrate 1 having been heated up to 90° C. Thus, the surface of the semiconductor substrate 1 is made to be hydrophobic, thereby improving the adhesion of the semiconductor substrate 1. In this manner, H in OH groups existing on the surface of the semiconductor substrate 1 is substituted with $Si(CH_3)_3$ (i.e., a trimethylsilyl group), resulting in producing $CH_3COCH_2COCH$ (acetylacetone) as is shown in FIG. 3(b). Then, by using the first coater, the semiconductor substrate 1 is coated with a chemically amplified resist, thereby forming a first resist film.

Next, by using the first exposure machine, the first resist film is exposed by using a desired mask.

Subsequently, by using the first developer, the exposed first resist film is successively subjected to the PEB and the development, thereby forming a first resist pattern. Then, subsequent procedures such as desired etching and desired film forming are conducted by using the thus formed first resist pattern.

When the first resist pattern is thus formed, an insoluble skin layer can be prevented from being formed on the surface of the first resist pattern 2 as is shown in FIG. 4. Specifically, after conducting the surface treatment with 4-trimethylsiloxy-3-penten-2-one on the semiconductor substrate 1, the semiconductor substrate 1 is coated with a chemically amplified positive resist (manufactured by Japan Synthetic Rubber Co., Ltd.; KRF K2G) in a thickness of 0.7 μm in the first coater so as to form the first resist film, and the first resist film is exposed by using a KrF excimer laser stepper with NA of 0.5 in the first exposure machine, and the exposed first resist film is subjected to the PEB for 90 seconds at a temperature of 100° C. and developed by using a 2.38 wt % aqueous solution of tetramethylammonium hydroxide in the first developer. FIG. 4 shows the sectional shape of the thus formed first resist pattern 2 of 0.25 μm line and space.

In the first half procedures of the method of manufacturing a semiconductor device of this embodiment, the surface treatment is conducted by using 4-trimethylsiloxy-3-penten-2-one as the surface treatment agent as described above. Therefore, the surface of the semiconductor substrate 1 can be made to be hydrophobic without producing an alkali component such as ammonia. Accordingly, an insoluble skin layer can be prevented from being formed on the first resist pattern 2, resulting in obtaining a stable pattern shape.

Now, the second half procedures of the method of manufacturing a semiconductor device of this embodiment by using the aforementioned manufacturing apparatus will be described with reference to FIGS. 5, 6(a), 6(b) and 7. In these second half procedures, a second resist pattern of a non-chemically amplified resist is formed by using the second coater, the second exposure machine and the second developer.

Figure 5:
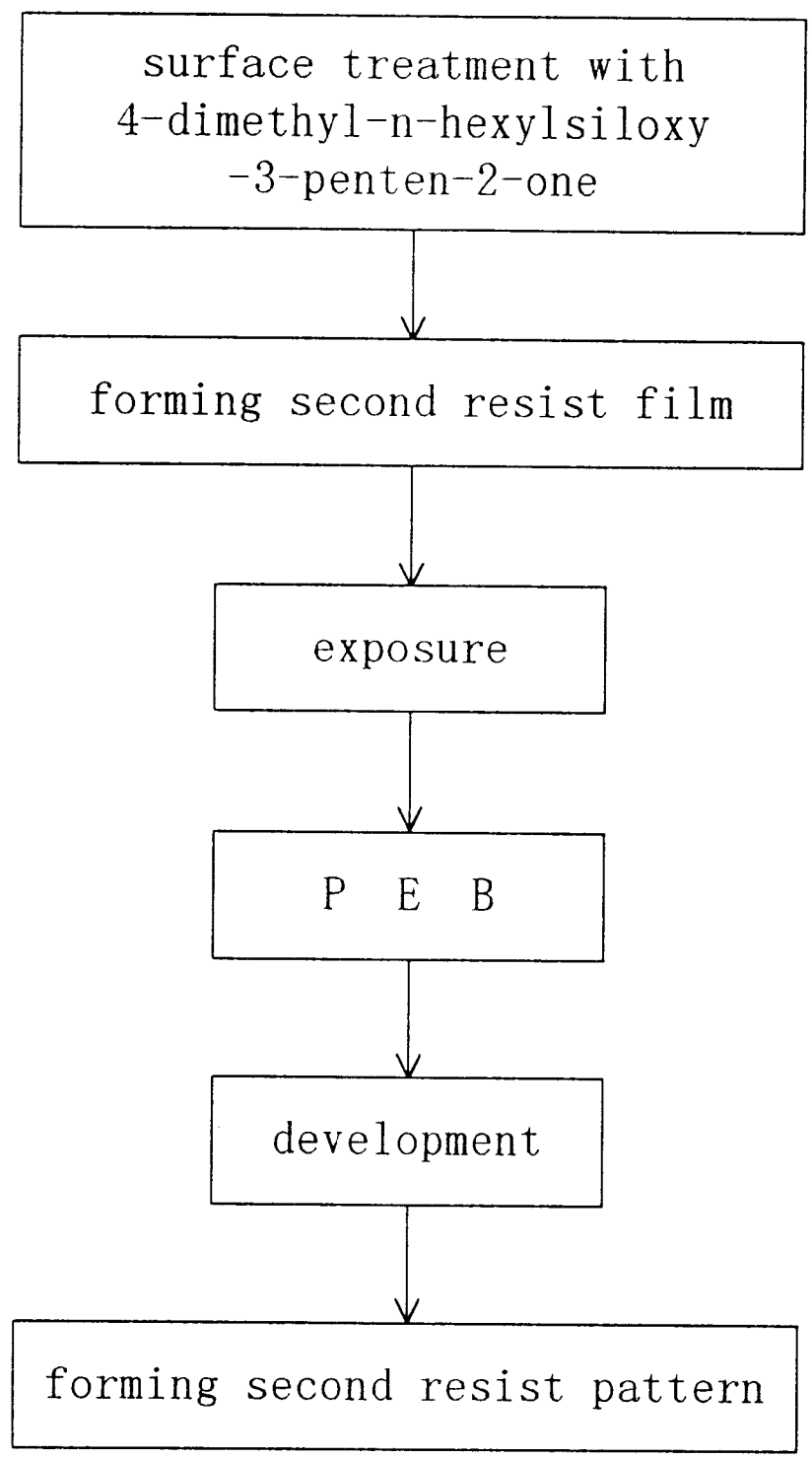
FIG. 5 is a flowchart for showing the second half procedures of the method of manufacturing a semiconductor device of the first embodiment.
Figure 6A:
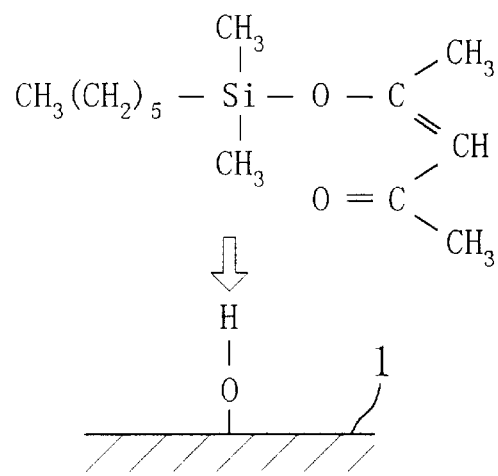
FIGS. 6(a) and 6(b) are schematic diagrams for showing the state of the surface of the semiconductor substrate obtained by supplying 4-dimethyl-n-hexylsiloxy-3-penten-2-one in the method of manufacturing a semiconductor device of the first embodiment.
Figure 6B:
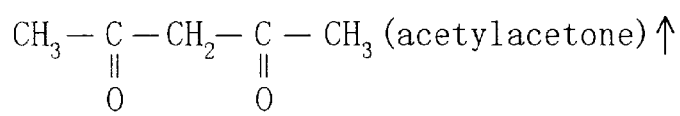
Figure 6B:
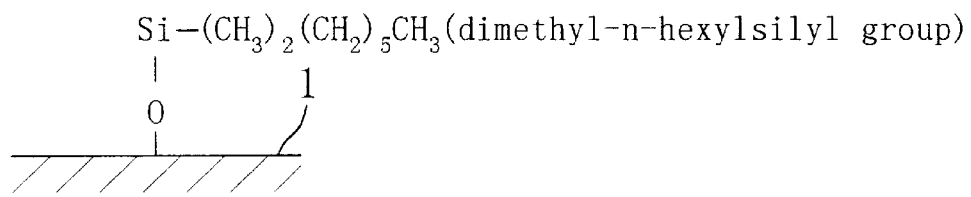
Figure 7:
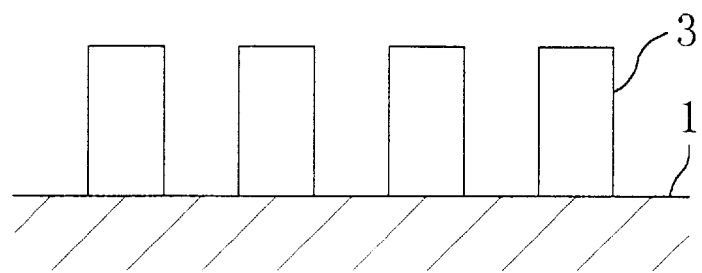
FIG. 7 is a schematic sectional view of a second resist pattern formed out of a non-chemically amplified resist by the method of manufacturing a semiconductor device of the first embodiment.

FIG. 5 is a flowchart for showing the procedures for forming a resist pattern of a non-chemically amplified resist, FIGS. 6(a) and 6(b) show the state of a surface of a semiconductor substrate obtained by conducting a surface treatment by using a surface treatment agent of the first embodiment, and FIG. 7 is a schematic sectional view of the second resist pattern formed out of a non-chemically amplified resist on the semiconductor substrate whose surface has been treated with the surface treatment agent of this embodiment.

First, by using the second coater, the surface of the semiconductor substrate 1 of silicon is supplied with 4-dimethyl-n-hexylsiloxy-3-penten-2-one serving as a surface treatment agent as is shown in FIG. 6(a). Specifically, 4-dimethyl-n-hexylsiloxy-3-penten-2-one is bubbled with a nitrogen gas and then sprayed for 30 seconds onto the surface of the semiconductor substrate 1 having been heated up to 90° C. Thus, the surface of the semiconductor substrate 1 is made to be hydrophobic, thereby improving the adhesion of the semiconductor substrate 1. In this manner, H in OH groups existing on the surface of the semiconductor substrate 1 is substituted with $Si(CH_3)_2(CH_2)_5CN_3$ (i.e., a dimethyl-n-hexylsilyl group), resulting in producing $CH_3COCH_2COCH_3$ (acetylacetone) as is shown in FIG. 6(b). Then, by using the second coater, the semiconductor substrate 1 is coated with a non-chemically amplified resist, thereby forming a second resist film.

Next, by using the second exposure machine, the second resist film is exposed by using a desired mask.

Subsequently, by using the second developer, the exposed second resist film is successively subjected to the PEB and the development, thereby forming a second resist pattern.

Then, subsequent procedures such as desired etching and desired film forming are conducted by using the thus formed second resist pattern.

When the second resist pattern is thus formed, the second resist pattern 3 can be formed in a good shape free from peeling as is shown in FIG. 7. Specifically, after conducting the surface treatment with 4-dimethyl-n-hexylsiloxy-3-penten-2-one on the semiconductor substrate 1, the semiconductor substrate 1 is coated with a non-chemically amplified positive resist (manufactured by Sumitomo Chemical Co.; PFI-38) in a thickness of 1.0 μm in the second coater so as to form the second resist film, and the second resist film is exposed by using an i-line stepper with NA of 0.6 in the second exposure machine, and the exposed second resist film is subjected to the PEB for 90 seconds at a temperature of 100° C. and developed by using a 2.38 wt % aqueous solution of tetramethylammonium hydroxide in the second developer. FIG. 7 shows the sectional shape of the thus formed second resist pattern 3 of 0.30 μm line and space.

In the second half procedures of the method of manufacturing a semiconductor device of this embodiment, the surface treatment is conducted by using 4-dimethyl-n-hexylsiloxy-3-penten-2-one as the surface treatment agent as described above. Therefore, the adhesion between the second resist pattern 3 and the semiconductor substrate 1 can be improved without producing an alkali component such as ammonia, resulting in obtaining a good pattern shape free from peeling.

In this manner, in the method of manufacturing a semiconductor device of the first embodiment, the surface treatment agents which do not produce an alkali component are used both in the surface treatment conducted in forming the first resist pattern of a chemically amplified resist and in the surface treatment conducted in forming the second resist pattern of a non-chemically amplified resist. Therefore, in both the surface treatments, no alkali component is produced, and hence, no alkali component exists in the clean room where the method of manufacturing a semiconductor device of the first embodiment is adopted. As a result, no insoluble skin layer is formed on the surface of the first resist pattern of a chemically amplified resist, and the resultant first resist pattern can attain a good pattern shape.

Also, in the method of manufacturing a semiconductor device of the first embodiment, 4-dimethyl-n-hexylsiloxy-3-penten-2-one is used as the surface treatment agent in the surface treatment conducted in forming the second resist pattern of a non-chemically amplified resist. Thus, the second resist pattern of a non-chemically amplified resist can be good in adhesion.

EMBODIMENT 2

The first half procedures of a method of manufacturing a semiconductor device according to a second embodiment of the invention by using the aforementioned manufacturing apparatus will be described with reference to FIG. 8. In these first half procedures, a first resist pattern is formed out of a chemically amplified resist by using the first coater, the first exposure machine and the first developer.

Figure 8:
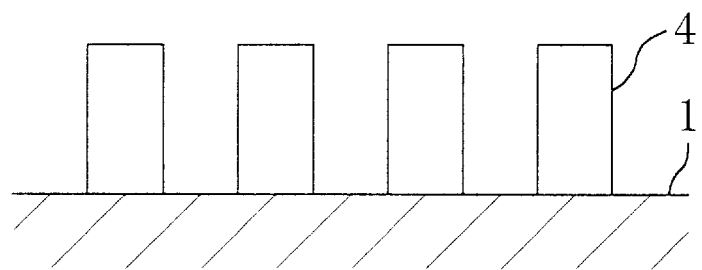
FIG. 8 is a schematic sectional view of a first resist pattern formed out of a chemically amplified resist by a method of manufacturing a semiconductor device according to a second embodiment of the invention.

FIG. 8 is a schematic sectional view of the first resist pattern formed out of a chemically amplified resist on a semiconductor substrate whose surface has been treated with a surface treatment agent of the second embodiment.

First, by using the first coater, the surface of a semiconductor substrate 1 of silicon is supplied with 4-trimethylsiloxy-3-penten-2-one serving as a surface treatment agent in the same manner as in the first embodiment.

Thus, the surface of the semiconductor substrate 1 is made to be hydrophobic, thereby improving the adhesion of the semiconductor substrate 1. In this manner, H in OH groups existing on the surface of the semiconductor substrate 1 is substituted with $Si(CH_3)_3$ (i.e., a trimethylsilyl group), resulting in producing $CH_3COCH_2COCH_3$ (acetylacetone) as in the first embodiment. Then, by using the first coater, the semiconductor substrate 1 is coated with a chemically amplified resist, thereby forming a first resist film.

Next, by using the first exposure machine, the first resist film is exposed by using a desired mask.

Subsequently, by using the first developer, the exposed first resist film is successively subjected to the PEB and the development, thereby forming a first resist pattern. Then, subsequent procedures such as desired etching and desired film forming are conducted by using the thus formed first resist pattern.

When the first resist pattern is thus formed, an insoluble skin layer can be prevented from being formed on the surface of the first resist pattern 4 as is shown in FIG. 8. Specifically, after conducting the surface treatment with 4-trimethylsiloxy-3-penten-2-one on the semiconductor substrate 1, the semiconductor substrate 1 is coated with a chemically amplified positive resist (manufactured by Japan Synthetic Rubber Co., Ltd.; KRF K2G) in a thickness of 0.7 $\mu$m in the first coater so as to form the first resist film, and the first resist film is exposed by using a KrF excimer laser stepper with NA of 0.5 in the first exposure machine, and the exposed first resist film is subjected to the PEB for 90 seconds at a temperature of 100° C. and developed by using a 2.38 wt % aqueous solution of tetramethylammonium hydroxide in the first developer. FIG. 8 shows the sectional shape of the thus formed first resist pattern 4 of 0.25 $\mu$m line and space.

In the first half procedures of the method of manufacturing a semiconductor device of this embodiment, the surface treatment is conducted by using 4-trimethylsiloxy-3-penten-2-one as the surface treatment agent as described above. Therefore, the surface of the semiconductor substrate 1 can be made to be hydrophobic without producing an alkali component such as ammonia. Accordingly, an insoluble skin layer can be Heprevented from being formed on the first resist pattern 4, resulting in obtaining a stable pattern shape.

Now, the second half procedures of the method of manufacturing a semiconductor device of the second embodiment by using the aforementioned manufacturing apparatus will be described with reference to FIG. 9. In these second half procedures, a second resist pattern of a non-chemically amplified resist is formed by using the second coater, the second exposure machine and the second developer.

Figure 9:
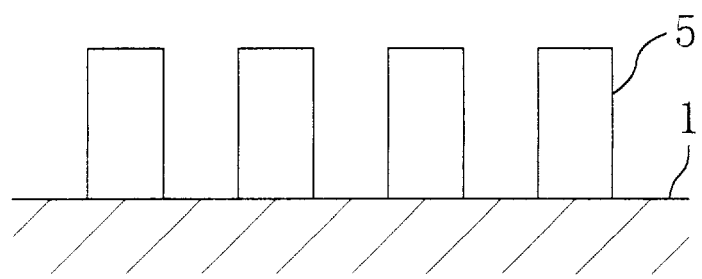
FIG. 9 is a schematic sectional view of a second resist pattern formed out of a non-chemically amplified resist by the method of manufacturing a semiconductor device of the second embodiment.
Figure 10:
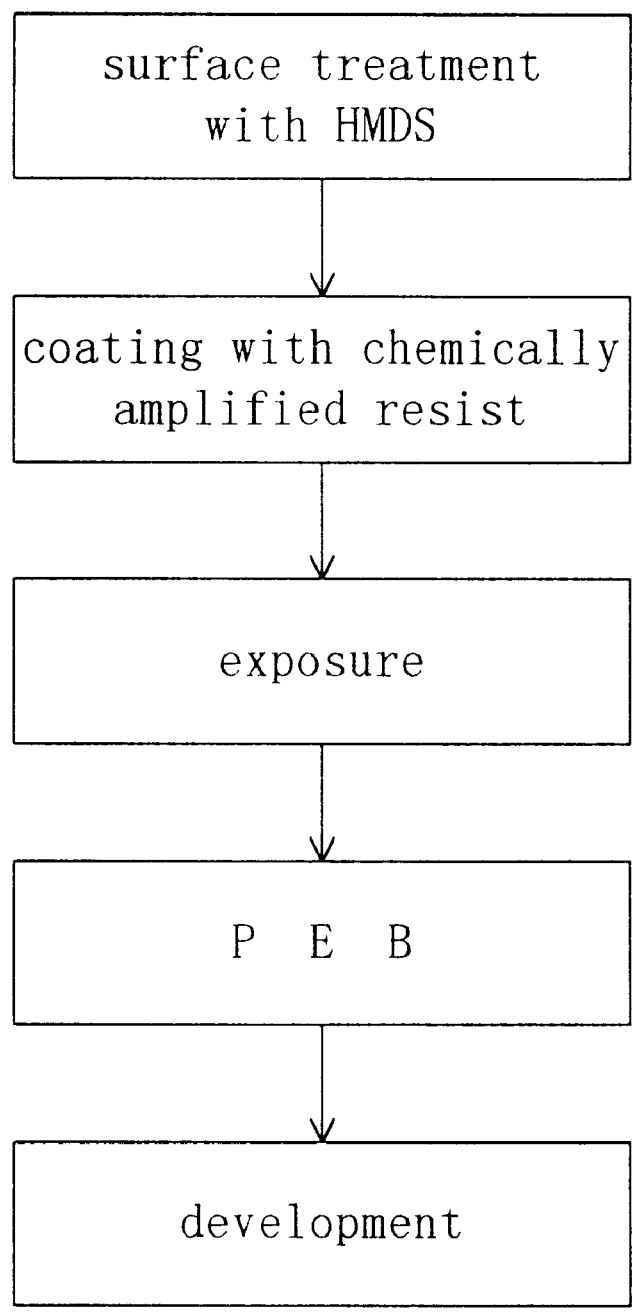
FIG. 10 is a flowchart for showing the first half procedures of a conventional method of manufacturing a semiconductor device.
Figure 11A:
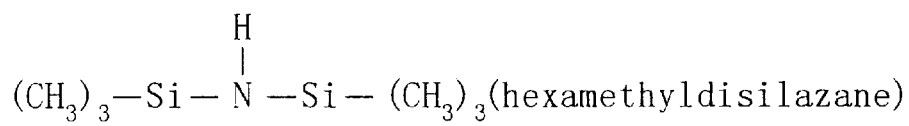
FIGS. 11(a) and 11(b) are schematic diagrams for showing the state of a surface of a semiconductor substrate obtained by supplying HMDS in the first half procedures of the conventional method of manufacturing a semiconductor device.
Figure 11A:
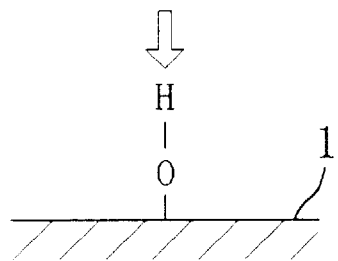
Figure 11B:
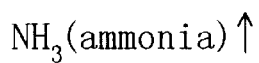
Figure 11B:
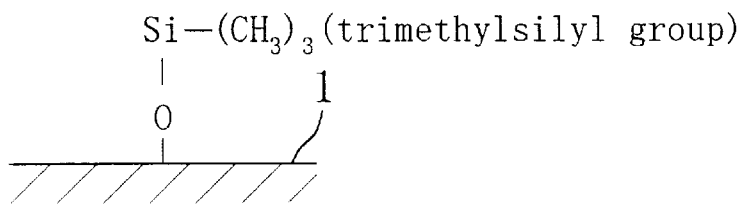
Figure 12:
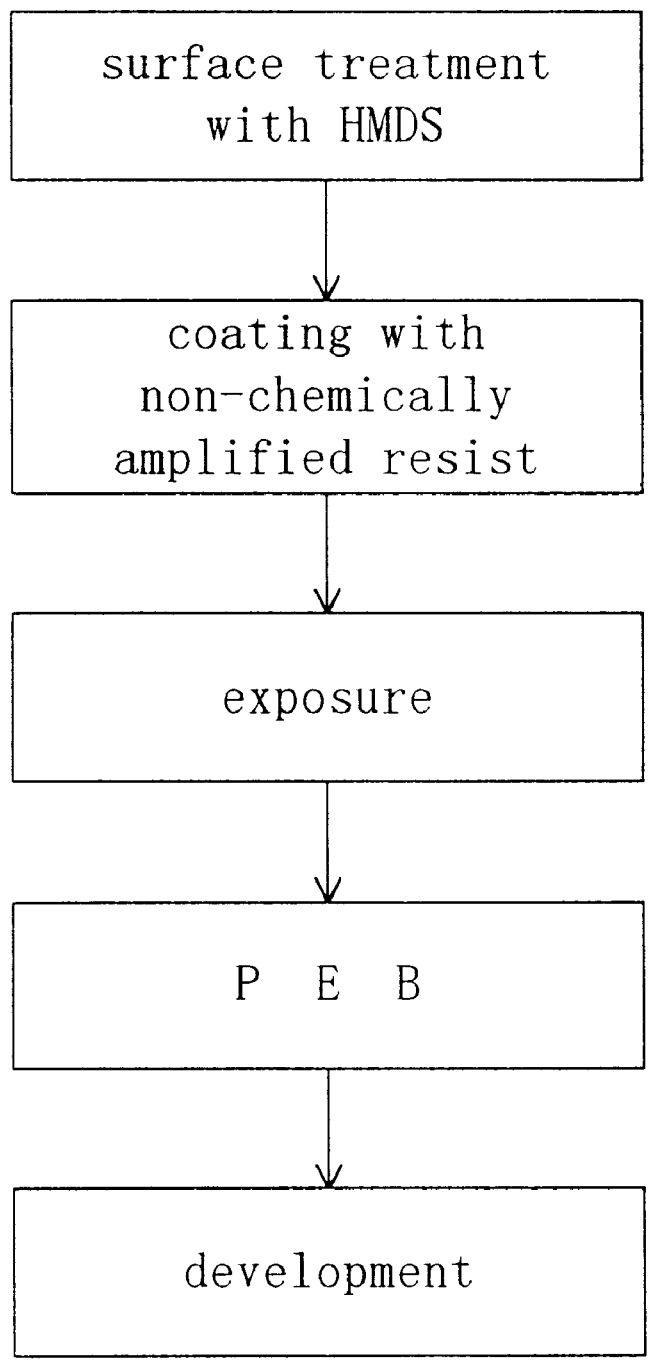
FIG. 12 is a flowchart for showing the second half procedures of the conventional method of manufacturing a semiconductor device.
Figure 13A:
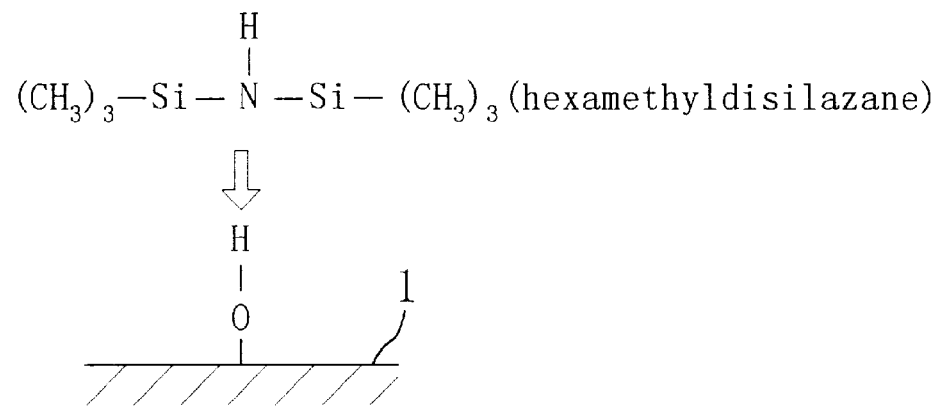
FIGS. 13(a) and 13(b) are schematic diagrams for showing the state of the surface of the semiconductor substrate obtained by supplying HMDS in the second half procedures of the conventional method of manufacturing a semiconductor device.
Figure 13B:
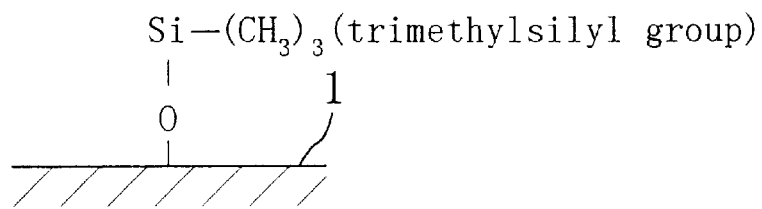
Figure 14:
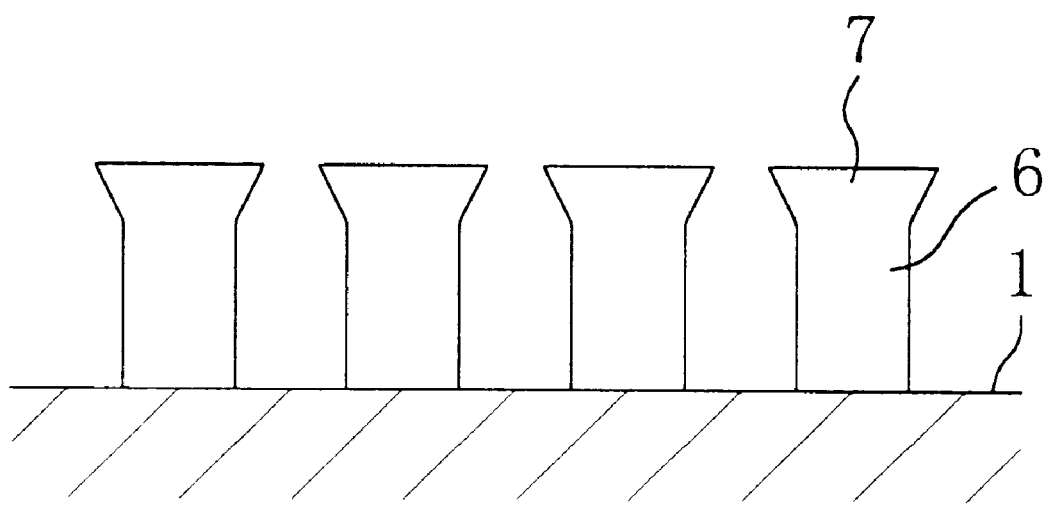
FIG. 14 is a schematic sectional view of a resist pattern formed out of a chemically amplified resist by the conventional method of manufacturing a semiconductor device.
Figure 15:
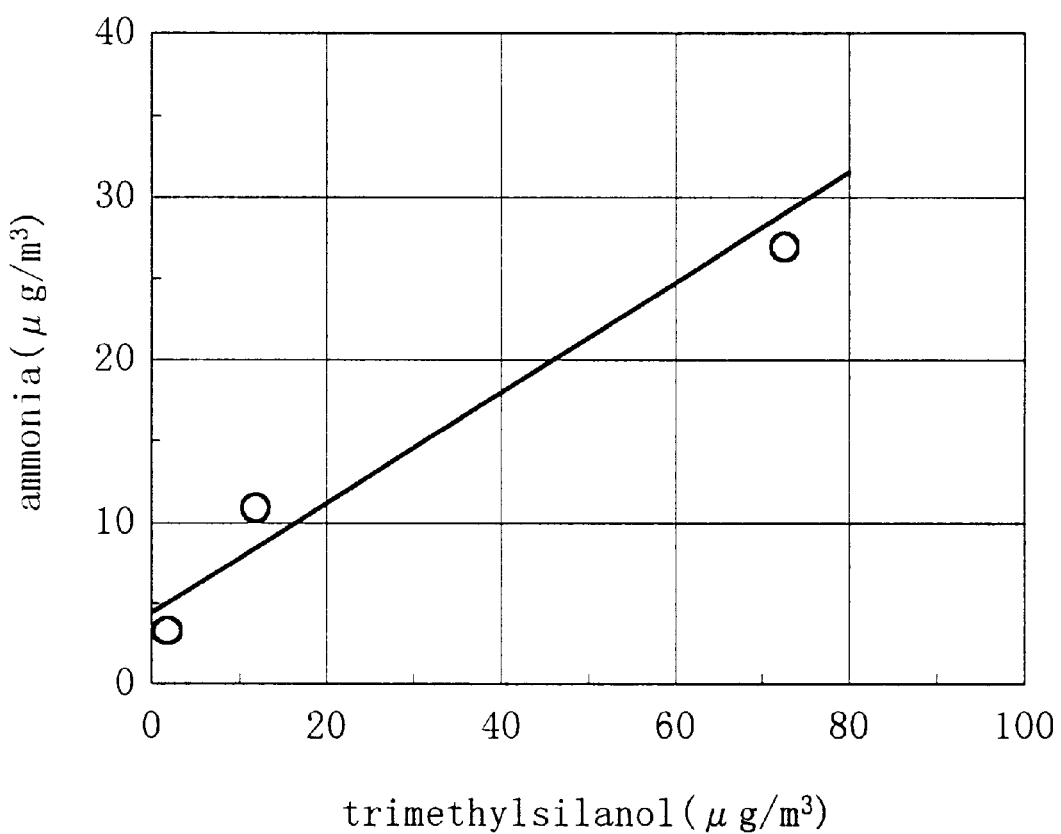
FIG. 15 is a diagram for showing correlation between a concentration of trimethylsilanol, that is, a decomposition of HMDS, and a concentration of ammonia in the atmosphere.

FIG. 9 is a schematic sectional view of the second resist pattern formed out of a non-chemically amplified resist on the semiconductor substrate whose surface has been treated with a surface treatment agent of this embodiment.

First, by using the second coater, the surface of the semiconductor substrate 1 of silicon is supplied with 4-trimethylsiloxy-3-penten-2-one serving as a surface treatment agent in the same manner as in the first half procedures of the second embodiment. Thus, the surface of the semiconductor substrate 1 is made to be hydrophobic, thereby improving the adhesion of the semiconductor substrate 1. In this manner, H in OH groups existing on the surface of the semiconductor substrate 1 is substituted with $Si(CH_3)_3$ (i.e., a trimethylsilyl group), resulting in producing $CH_3COCH_2COCH_3$ (acetylacetone) in the same manner as in the first half procedures of the second embodiment. Then, by using the second coater, the semiconductor substrate 1 is coated with a non-chemically amplified resist, thereby forming a second resist film.

Next, by using the second exposure machine, the second resist film is exposed by using a desired mask.

Subsequently, by using the second developer, the exposed second resist film is successively subjected to the PEB and the development, thereby forming a second resist pattern. Then, subsequent procedures such as desired etching and desired film forming are conducted by using the thus formed second resist pattern.

When the second resist pattern is thus formed, the second resist pattern 5 can be formed in a good shape free from peeling as is shown in FIG. 9. Specifically, after conducting the surface treatment with 4-trimethylsiloxy-3-penten-2-one on the semiconductor substrate 1, the semiconductor substrate 1 is coated with a non-chemically amplified positive resist (such as manufactured by Sumitomo Chemical Co.; under the trademark PFI-38) in a thickness of 1.0 $\mu$m in the second coater so as to form the second resist film, and the second resist film is exposed by using an i-line stepper with NA of 0.6 in the second exposure machine, and the exposed second resist film is subjected to the PEB for 90 seconds at a temperature of 100° C. and developed by using a 2.38 wt % aqueous solution of tetramethylammonium hydroxide in the second developer. FIG. 9 shows the sectional shape of the thus formed second resist pattern 5 of 0.30 $\mu$m line and space.

In the second half procedures of the method of manufacturing a semiconductor device of this embodiment, the surface treatment is conducted by using 4-trimethylsiloxy-3-penten-2-one as the surface treatment agent as described above. Therefore, the adhesion between the second resist pattern 5 and the semiconductor substrate 1 can be improved without producing an alkali component such as ammonia, resulting in obtaining a good pattern shape free from peeling.

In this manner, in the method of manufacturing a semiconductor device of the second embodiment, the surface treatment agent which does not produce an alkali component is used both in the surface treatment conducted in forming the first resist pattern of a chemically amplified resist and in the surface treatment conducted in forming the second resist pattern of a non-chemically amplified resist. Therefore, in both the surface treatments, no alkali component is produced, and hence, the concentration of an alkali component in the clean room where the method of manufacturing a semiconductor device of the second embodiment is adopted is as low as 1 $\mu/m^3$. As a result, no insoluble skin layer is formed on the surface of the first resist pattern of a chemically amplified resist, and the resultant first resist pattern can attain a good pattern shape.

Also, in the method of manufacturing a semiconductor device of the second embodiment, 4-trimethylsiloxy-3-penten-2-one is used as the surface treatment agent in the surface treatment conducted in forming the second resist pattern of a non-chemically amplified resist. Thus, the second resist pattern of a non-chemically amplified resist can be good in adhesion.

In the second embodiment, the same surface treatment agent is used both in the surface treatment conducted in forming the first resist pattern of a chemically amplified resist and in the surface treatment conducted in forming the second resist pattern of a non-chemically amplified resist. Therefore, both surface treatments can be conducted by using the same coater. In this manner, the throughput of the process can be improved and the foot print of the apparatus can be decreased as compared with the case where these surface treatments are conducted by using different coaters installed in different process zones.

Furthermore, in each of the first and second embodiments, the patterns are formed out of a chemically amplified resist in the first half procedures and out of a non-chemically amplified resist in the second half procedures. However, in any of the embodiments, the patterns can be formed out of a non-chemically amplified resist in the first half procedures and out of a chemically amplified resist in the second half procedures. Also in such a case, the same satisfactory results as in the first and second embodiments can be attained.

Moreover, in the first and second embodiments, the surface treatment agents which generate reaction decomposition including acetylacetone are used. Also, the surface treatment agent which generates a trimethylsilyl group or a dimethyl-n-hexylsilyl group as a material for making the surface of the semiconductor substrate hydrophobic is used in the first embodiment, and the surface treatment agent which generates a trimethylsilyl group as a material for making the surface of the semiconductor substrate hydrophobic is used in the second embodiment. However, the surface treatment agent is not limited to those described in these embodiments. Specifically, any surface treatment agent including a silane compound represented by the following general formula (1) is widely applicable:

$$R^1{}_{4-n}Si(OR)_n \qquad (1)$$

wherein n indicates an integer ranging between 1 and 3; R indicates a substituted or non-substituted saturated hydrocarbon group having 1 through 6 carbon atoms, a substituted or non-substituted unsaturated hydrocarbon group having 1 through 6 carbon atoms or a substituted or non-substituted alkylcarbonyl group having 1 through 6 carbon atoms; and $R^1$ is one group or a combination of two or more groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms and an alicyclic saturated hydrocarbon group having 3 through 6 carbon atoms.

A first example of the silane compound represented by the general formula (1) is a compound represented by the following general formula (3):

$$R^1{}_3SiOR \qquad (3)$$

wherein R and $R^1$ are defined in the same manner as in the general formula (1).

The silane compound represented by the general formula (3) includes one hydrolytic group on the Si atom, and this compound treats the surface of a semiconductor substrate to be a monomolecular film, thereby providing a film with high surface uniformity. Also, the silane compound represented by the general formula (3) is easily affected by steric hindrance of the $R^1$ substituted group, and this characteristic affects the reaction speed (treatment ability).

Specific examples of the silane compound represented by the general formula (3) include the following compounds:

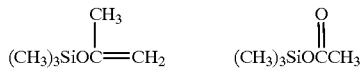

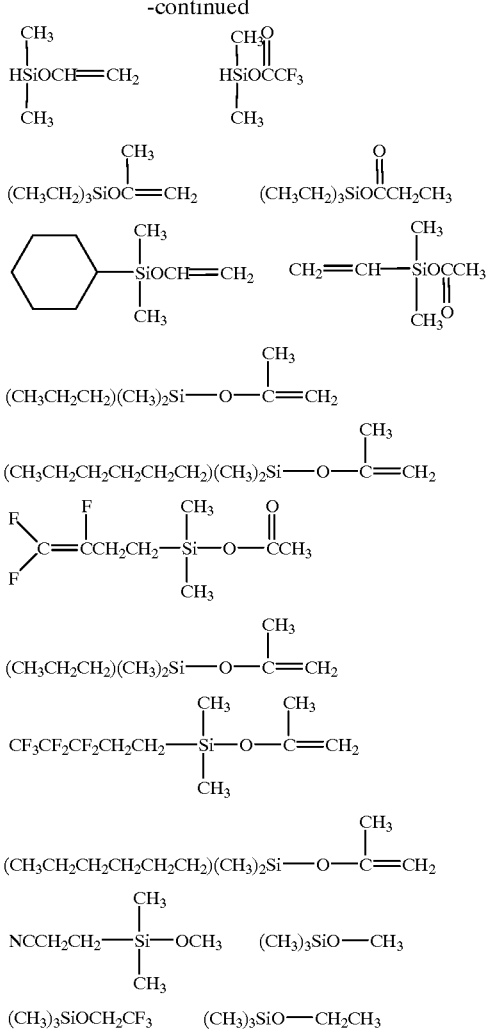

A second example of the silane compound represented by the general formula (1) is a compound represented by the following general formula (4):

$$R^1{}_2Si(OR)_2 \qquad (4)$$

wherein R and $R^1$ are defined in the same manner as in the general formula (1).

The silane compound represented by the general formula (4) includes two hydrolytic groups on the Si atom, and this compound treats the surface of a semiconductor substrate to be a laminate film and has a high treatment ability.

A specific example of the silane compound represented by the general formula (4) includes the following compound:

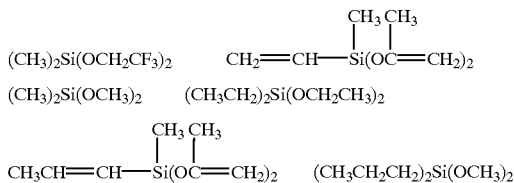

A third example of the silane compound represented by the general formula (1) is a compound represented by the following general formula (5):

R¹Si(OR)₃     (5)

wherein R and R¹ are defined in the same manner as in the general formula (1).

The silane compound represented by the general formula (5) includes three hydrolytic groups on the Si atom, treats the surface of a semiconductor substrate to be a laminate film, and has a high treatment ability. However, an unreacted part of the silane compound can be hydrolyzed by a water component in the air, so as to produce gel. Therefore, when this compound is used in the surface treatment agent, particle contamination can be caused depending upon the adopted treating method.

A specific example of the silane compound represented by the general formula (5) includes the following compound:

CH₃Si(OCH₃)₃     CH₃Si(OCH₂CH₃)₃

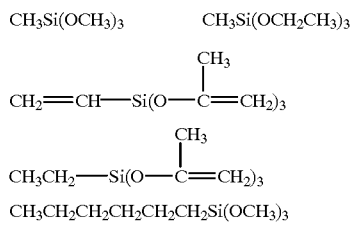

CH₃CH₂CH₂CH₂CH₂CH₂Si(OCH₃)₃

The silane compound represented by the general formula (3) has particularly high stability as a material, and the silane compound represented by the general formula (5) has particularly high reactivity.

Furthermore, any surface treatment agent including a silane compound represented by the following general formula (2) is adoptable:

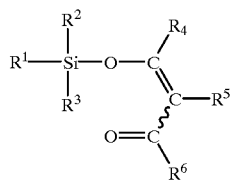     (2)

wherein R¹, R² and R are the same or different groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms; and R⁴, R⁵ and R⁶ are the same or different groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms, an alicyclic saturated hydrocarbon group having 3 through 6 carbon atoms and OR⁷ (wherein R⁷ is a hydrogen atom, a substituted or non-substituted saturated hydrocarbon group having 1 through 6 carbon atoms, a substituted or non-substituted unsaturated hydrocarbon group having 1 through 6 carbon atoms, or an alicyclic saturated hydrocarbon group having 3 through 6 carbon atoms).

Specific examples of the silane compound represented by the general formula (2) include the following compounds:

(a)
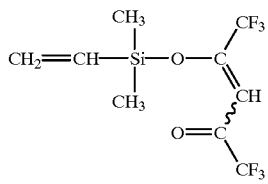

(b)
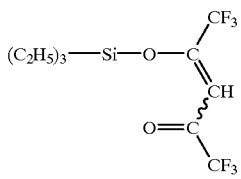

(c)
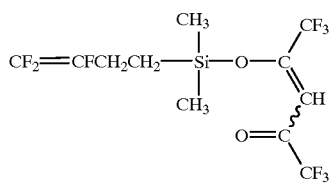

(d)
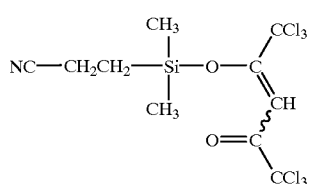

(e)
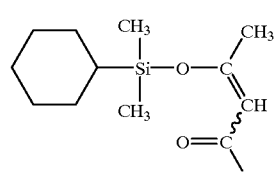

(f)
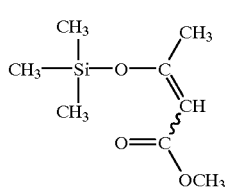

(g)
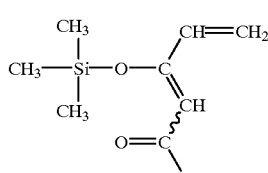

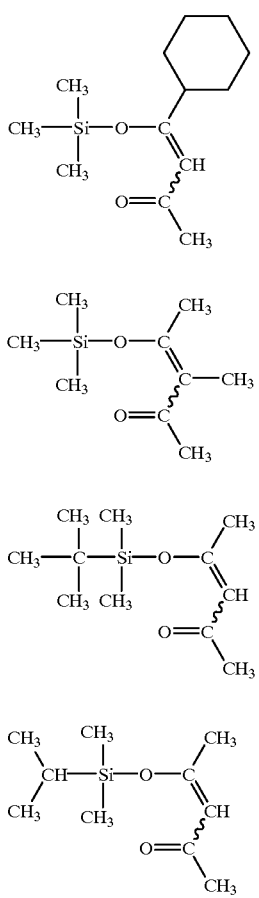

In the above-described chemical formulas, (a) indicates 3-dimethylvinylsiloxytrifluoromethyl-2-propen-1-trifluoromethyl-1-one; (b) indicates 3-triethylsiloxytrifluoromethyl-2-propen-1-trifluoromethyl-1-one; (c) indicates 3-dimethyl(3',4',4'-trifluoro-3'-butenyl)siloxytrifluoromethyl-2-propen-1-trifluoromethyl-1-one; (d) indicates 3-dimethyl(2'-cyanoethyl)siloxytrichioromethyl-2-propen-1-trichioromethyl-1-one; (e) indicates 4-dimethylcyclohexylsiloxy-3-penten-2-one; (f) indicates 2-trimethylsiloxy-1-methoxycarbonyl-1-propene; (g) indicates 4-trimethylsiloxy-3,5-hexadien-2-one; (h) indicates 4-trimethylsiloxy-4-cyclohexyl-3-buten-2-one; (i) indicates 4-trimethylsiloxy-3-methyl-3-penten-2-one; (j indicates 4-t-butyldimethylsiloxy-3-penten-2-one; and (k) indicates 2-isopropyldimethylsiloxy-1-methoxycarbonyl-1-propene.

In the first and second embodiments, the two-component system chemically amplified positive resist (KRF K2G) including an acid generator and a resin that is changed to be alkali-soluble by a function of an acid is used as the chemically amplified resist. However, this chemically amplified positive resist can be replaced with a three-component system chemically amplified positive resist including an acid generator, an alkali-soluble resin and a compound or a resin that is changed to be alkali-soluble by a function of an acid. Another example of the commercially available two-component system chemically amplified positive resist includes TDUR-DP007™ manufactured by Tokyo Ohka Kogyo Co., Ltd., and examples of the commercially available three-component system chemically amplified positive resist include DX561™ and DX981™ manufactured by Hoechst Japan Ltd.

Moreover, as the chemically amplified resist, a three-component system chemically amplified negative resist including an acid generator, an alkali-soluble resin and a compound or a resin that is crosslinked by a function of an acid can also be used. Examples of the three-component system chemically amplified negative resist include XP-8843™ and SAL-601™ manufactured by Shipley Company. Also in the application of such a chemically amplified negative resist, when an alkali component is produced in the surface treatment, the film thickness of the resist pattern can be decreased owing to the deactivation of an acid, resulting in degrading the shape of the resultant resist pattern. However, since the deactivation of an acid can be avoided in the present invention, the resultant resist pattern can attain a good shape owing to the method of this invention.

Since the chemically amplified resist is affected by an alkali component regardless of its composition or components, the first and second embodiments are applicable to all types of chemically amplified resists.

Examples of the components of the chemically amplified resists will now be described, and it is noted that these exemplified components do not limit the invention.

<Two-component system chemically amplified positive resist>

Resin that is changed to be alkali-soluble by a function of an acid:
poly(t-butoxycarbonyloxystyrene-co-hydroxystyrene)
poly(t-butoxycarbonylmethyloxystyrene-co-hydroxystyrene)
poly(tetrahydropyranyloxystyrene-co-hydroxystyrene)

Acid generator:
Onium salt, nitrobenzyl sulfonate

<Three-component system chemically amplified positive resist>

Alkali-soluble resin:
polyvinylphenol, polymethacrylic acid

Resin or compound that is changed to be alkali-soluble by a function of an acid:
poly(t-butoxycarbonyloxystyrene-co-hydroxystyrene)
poly(t-butoxycarbonylmethyloxystyrene-co-hydroxystyrene)
poly(tetrahydropyranyloxystyrene-co-hydroxystyrene)

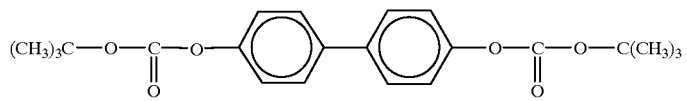

-continued

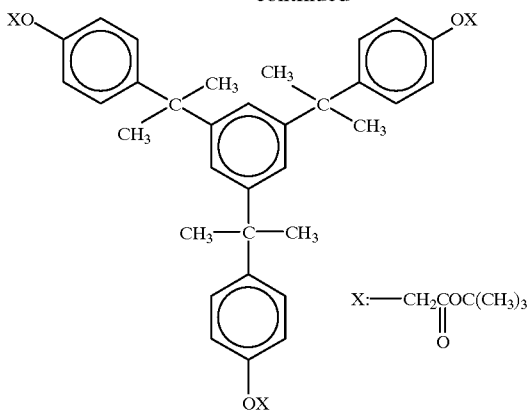

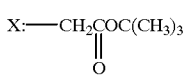

Acid generator:
   Onium salt, nitrobenzyl sulfonate

<Three-component system chemically amplified negative resist>

Alkali-soluble resin:
   polyvinylphenol, polymethacrylic acid

Compound or resin that is crosslinked by a function of an acid:
   melamine compound, melamine resin Acid generator:
   Onium salt, nitrobenzyl sulfonate

What is claimed is:

1. A method of manufacturing a semiconductor device comprising:

a first resist film forming step of forming a first resist film in a clean room by conducting a surface treatment on a first semiconductor substrate with a surface treatment agent comprising a silane compound represented by the following general formula and successively coating the treated surface of said first semiconductor substrate with a chemically amplified resist;

a first exposing step of exposing said first resist film in the clean room by using a mask having a desired pattern shape;

a first developing step of forming a first resist pattern in the clean room by developing said exposed first resist film;

a second resist film forming step of forming a second resist film in the clean room by conducting a surface treatment on a second semiconductor substrate with a surface treatment agent comprising a silane compound represented by the general formula and by successively coating the treated surface of said second semiconductor substrate with a non-chemically amplified resist;

a second exposing step of exposing said second resist film in the clean room by using a mask having a desired pattern shape; and a second developing step of forming a second resist pattern in the clean room by developing said exposed second resist film wherein said silane compound is represented by the following general formula:

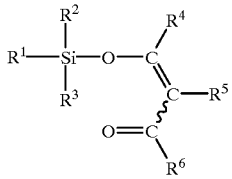

wherein $R^1$, $R^2$ and $R^3$ are the same or different groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms, and an alicyclic saturated hydrocarbon group having 3 through 6 carbon atoms; and $R^4$, $R^5$ and $R^6$ are the same or different groups selected from the group consisting of a hydrogen atom, a substituted or non-substituted saturated hydrocarbon group having 1 through 6 carbon atoms, a substituted or non-substituted unsaturated hydrocarbon group having 1 through 6 carbon atoms, an alicyclic saturated hydrocarbon group having 3 through 6 carbon atoms and $OR^7$ (wherein $R^7$ is a hydrogen atom, a substituted or non-substituted saturated hydrocarbon group having 1 through 6 carbon atoms, a substituted or non-substituted unsaturated hydrocarbon group having 1 through 6 carbon atoms, or an alicyclic saturated hydrocarbon group having 3 through 6 carbon atoms).

2. The method of manufacturing a semiconductor device of claim 1,
   wherein said chemically amplified resist comprises an acid generator and a resin that is changed to be alkali-soluble by a function of an acid.

3. The method of manufacturing a semiconductor device of claim 1,
   wherein said chemically amplified resist comprises an acid generator, an alkali-soluble resin and a compound or resin that is changed to be alkali-soluble by a function of an acid.

4. The method of manufacturing a semiconductor device of claim 1,
   wherein said chemically amplified resist comprises an acid generator, an alkali-soluble resin and a compound or resin that is crosslinked by a function of an acid.

5. The method of manufacturing a semiconductor device of claim 1,
   wherein said non-chemically amplified resist comprises a naphthoquinone diazido compound and a novolak resin.

* * * * *

UNITED STATES PATENT AND TRADEMARK OFFICE
CERTIFICATE OF CORRECTION

PATENT NO. : 6,174,650 B1
DATED : January 16, 2001
INVENTOR(S) : Masayuki Endo, et al.

It is certified that error appears in the above-identified patent and that said Letters Patent is hereby corrected as shown below:

On the Title page:

Section [73], add --Shin-Etsu Chemical Co., Ltd., Tokyo (JP)--, as the second Assignee.

Signed and Sealed this

Thirty-first Day of July, 2001

*Attest:*

NICHOLAS P. GODICI
*Attesting Officer*   *Acting Director of the United States Patent and Trademark Office*